(12) United States Patent
Shishido et al.

(10) Patent No.: US 8,846,274 B2
(45) Date of Patent: Sep. 30, 2014

(54) MASK BLANK, TRANSFER MASK AND PROCESS FOR MANUFACTURING SEMICONDUCTOR DEVICES

(75) Inventors: Hiroaki Shishido, Shinjuku-ku (JP); Osamu Nozawa, Shinjuku-ku (JP); Atsushi Kominato, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 13 days.

(21) Appl. No.: 13/605,125

(22) Filed: Sep. 6, 2012

(65) Prior Publication Data
US 2013/0059236 A1    Mar. 7, 2013

(30) Foreign Application Priority Data
Sep. 7, 2011  (JP) ................. 2011-195078

(51) Int. Cl.
*G03F 1/00* (2012.01)
*G03F 1/50* (2012.01)

(52) U.S. Cl.
USPC ............................. 430/5; 428/426

(58) Field of Classification Search
USPC ............... 430/5; 428/428, 432, 426
See application file for complete search history.

(56) References Cited

U.S. PATENT DOCUMENTS

2005/0244722 A1*  11/2005  Okada et al. ............ 430/5
2009/0226826 A1    9/2009   Nozawa
2010/0143831 A1    6/2010   Yoshikawa et al.

FOREIGN PATENT DOCUMENTS

| JP | 2004-026586 A | 1/2004 |
| JP | 2006-078807 A | 3/2006 |
| JP | 2009-230112 A | 10/2009 |
| JP | 2010-192503 A | 9/2010 |

\* cited by examiner

*Primary Examiner* — Stephen Rosasco
(74) *Attorney, Agent, or Firm* — Sughrue Mion, PLLC

(57) ABSTRACT

The present invention is the mask blank includes a glass substrate and a thin film formed on a main surface of the glass substrate, the thin film includes a material containing tantalum and substantially no hydrogen, and the mask blank has a invasion suppressive film between the main surface of the glass substrate and the thin film which suppresses hydrogen from being invaded from the glass substrate into the thin film.

18 Claims, 5 Drawing Sheets

Chamfer faces 73　　　Main surfaces 71　　Side faces 72

MASK BLANK, TRANSFER MASK AND PROCESS FOR MANUFACTURING SEMICONDUCTOR DEVICES

TECHNICAL FIELD

The present invention relates to a mask blank and a transfer mask provided with a low stress thin film. In particular, the invention relates to a mask blank and a transfer mask that are provided with a thin film having a reduced change in stress with the passage of time. Further, the invention relates to a process for manufacturing semiconductor devices using the transfer masks.

BACKGROUND ART

In general, manufacturing steps for semiconductor devices involve forming a fine pattern by a photolithographic method. In the formation of this fine pattern, many substrates called transfer masks are typically used. Such transfer masks are generally transparent glass substrates on which a fine pattern formed of a thin metal film, for example, is provided. A photolithographic method is also used in the production of these transfer masks.

In the photolithographic production of transfer masks, mask blanks are used. The mask blanks have a thin film (for example, a light shielding film) for forming a transfer pattern (a mask pattern) on a transparent substrate such as a glass substrate. A transfer mask is produced from a mask blank through the steps including an exposure step in which a desired pattern is drawn in a resist film formed on the mask blank, a development step in which the resist film is developed in accordance with the desired pattern to form a resist pattern, an etching step in which a thin film of the mask blank is etched through the resist pattern, and a step in which the remaining resist pattern is removed by stripping. In the development step, after a desired pattern is drawn (by exposure) in a resist film formed on the mask blank, a developer is supplied and portions of the resist film which are soluble by the developer are dissolved away, thus forming a resist pattern. In the etching step, dry etching or wet etching is performed using this resist pattern as a mask to dissolve exposed portions of the thin film where the resist pattern is not formed. As a result, a desired mask pattern can be formed on the transparent substrate. A transfer mask is produced in this manner.

Fabricating finer patterns in semiconductor devices requires the miniaturization of mask patterns formed in transfer masks as well as that the wavelength of an exposure light source used in photolithography should be shorter. In recent years, exposure light sources in semiconductor device production have shifted towards shorter wavelengths, namely, from KrF excimer lasers (wavelength 248 nm) to ArF excimer lasers (wavelength 193 nm).

Heretofore, as transfer masks, binary masks which have a light shielding film pattern comprising of a chromium-containing material on a transparent substrate are known.

Binary masks designed for ArF excimer lasers have been recently developed which use a material containing a molybdenum silicide compound (a MoSi-containing material) as a light shielding film (Patent Literature 1: JP-A-2006-78807). Also binary masks for ArF excimer lasers which use a material containing a tantalum compound (a tantalum-containing material) as a light shielding film, are developed (Patent Literature 2: JP-A-2009-230112). Patent Literature 3 (JP-A-2010-192503) discloses that if a photomask which includes a light shielding film containing tantalum, niobium, vanadium or at least two metals of tantalum, niobium and vanadium is washed by acid washing or hydrogen plasma, the light shielding film undergoes hydrogen embrittlement and the film light shielding is sometimes deformed. According to the disclosure, this problem is addressed by forming a hydrogen block film which air-tightly covers the top and side faces of the light shielding film after patterning of the light shielding film.

On the other hand, Patent Literature 4 (JP-A-2004-26586) describes a process for producing mask substrates for vacuum UV lights from synthetic quartz glass. This literature indicates that it is necessary for the OH group content in synthetic quartz glass to be reduced in order to improve the transmittance of the synthetic quartz glass to vacuum UV lights. It is disclosed that one solution is to reduce the Si—H content and the $H_2$ content in synthetic quartz glass to or below specific levels.

BRIEF SUMMARY OF THE INVENTION

Recently, the required level of pattern position accuracy for transfer masks has been becoming particularly strict. One factor for realizing high pattern position accuracy is to improve the flatness of a mask blank that is an original plate for the fabrication of a transfer mask. To improve the flatness of a mask blank, it is necessary that the flatness is improved on the main surface of a glass substrate on which a thin film is formed. The preparation of a glass substrate for forming a mask blank begins with producing a glass ingot and cutting it into a shape of the glass substrate as described in Patent Literature 4 (JP-A-2004-26586). The glass substrate immediately after being cut out has poor flatness and a rough surface condition on the main surfaces. Thus, the glass substrate is subjected to multistage grinding steps and polishing steps to attain high flatness and good surface roughness (mirror surface). After the polishing step with polishing abrasive particles, the glass substrate is washed with a cleaning liquid containing a hydrofluoric acid solution or a hydrofluorosilicic acid solution. Prior to the step of forming a thin film, the substrate is sometimes washed with a cleaning liquid containing an alkali solution.

However, this approach alone is insufficient to produce mask blanks with high flatness. If a high film stress is generated in a thin film which is formed above the main surface of the glass substrate on which a pattern forms, the substrate is deformed and the flatness is deteriorated. Thus, various countermeasures have been adopted during or after film production for reducing the film stress of a thin film for forming a pattern. It has been thought that mask blanks adjusted to high flatness by implementing such countermeasures did not change their flatness markedly even if the mask blanks were stored for a relatively long term (for example, about half a year) after production as long as they were tightly housed in cases. However, it was confirmed that mask blanks whose thin film for pattern formation included a tantalum-containing material were deteriorated in flatness on the main surfaces with the passage of time after production even if they were tightly housed in cases. In detail, the flatness of the main surface on the side where the thin film was formed was deteriorated such that the surface having a tendency to become more convex with the passage of time.

In case a glass substrate is not the cause, the deterioration in flatness of the main surfaces of a mask blank indicates that the film stress of a thin film has shown a tendency to gradually become more compressive. Such a marked phenomenon has not been observed in mask blanks which have a thin film comprising of a chromium-containing material or a molybdenum silicide compound-containing material. This fact probably means that the phenomenon observed in a mask blank in which a pattern-forming thin film includes a tantalum-containing material is caused not by the deformation of a glass substrate itself but by the compressive stress of the thin film being increased with the passage of time. Further, the use of a mask blank having such a thin film with high compressive stress in the fabrication of a transfer mask causes another problem which is that the pattern comes to have a large displacement in regions of the thin film which have been released from the film stress by the formation of the pattern. Even if a transfer mask is fabricated soon after the production of a mask blank, the pattern ends up having a displacement after fabrication with the passage of time.

The present invention has been made in view of the circumstances described above. It is therefore an object of the invention to provide a mask blank and a transfer mask in which a pattern-forming thin film includes a tantalum-containing material, which can solve the problem of the tendency of the film stress of the thin film to become more compressive with the passage of time. Another object is to provide a process for manufacturing semiconductor devices with a reduced probability of the occurrence of defects by the use of the above transfer masks.

To achieve the above objects, some aspects of the invention are directed to a mask blank having the following configurations 1 to 9, a transfer mask having the following configuration 10, and a process for manufacturing semiconductor devices having the following configuration 11.

Configuration 1

A mask blank including a glass substrate and a thin film formed above a main surface of the glass substrate, wherein the thin film includes a material containing tantalum and substantially no hydrogen, and the mask blank has a invasion suppressive film between the main surface of the glass substrate and the thin film, and the invasion suppressive film suppresses hydrogen from being invaded from the glass substrate into the thin film.

Configuration 2

The mask blank described in the configuration 1, wherein the invasion suppressive film comprises a material containing tantalum and oxygen.

Configuration 3

The mask blank described in the configuration 2, wherein the invasion suppressive film contains oxygen at not less than 50 at % (atomic %).

Configuration 4

The mask blank described in any one of the configurations 1 to 3, wherein the invasion suppressive film is formed in contact with the main surface of the glass substrate on the side where the thin film is formed.

Configuration 5

The mask blank described in any one of the configurations 1 to 4, wherein the main surface of the glass substrate on the side where the thin film is formed has a surface roughness of not more than 0.2 nmRq.

Configuration 6

The mask blank described in any one of the configurations 1 to 5, wherein the thin film includes a material which contains tantalum and nitrogen and does not substantially contain hydrogen.

Configuration 7

The mask blank described in the configuration 6, wherein a highly oxidized layer containing oxygen at not less than 60 at % is formed as a surface layer of the thin film.

Configuration 8

The mask blank described in any one of the configurations 1 to 5, wherein the thin film has a structure in which a lower layer and an upper layer are laminated in this order from the glass substrate side, the lower layer includes a material which contains tantalum and nitrogen and does not substantially contain hydrogen, and the upper layer includes a material which contains tantalum and oxygen.

Configuration 9

The mask blank described in the configuration 8, wherein a highly oxidized layer containing oxygen at not less than 60 at % is formed as a surface layer of the upper layer.

Configuration 10

A transfer mask wherein a transfer pattern is formed in the thin film of the mask blank described in any one of the configurations 1 to 9.

Configuration 11

A process for manufacturing semiconductor devices using the transfer mask described in the configuration 10, wherein the process comprises transferring the transfer pattern to a resist film on a semiconductor substrate by exposing the resist film through the transfer mask.

According to the mask blank and the transfer mask provided by the present invention, which have a pattern-forming thin film including a tantalum-containing material, the thin film is suppressed from having a tendency of the film stress to become more compressive with the passage of time. Further, the process for manufacturing semiconductor devices according to the invention allows for the manufacturing of semiconductor devices having fine circuit patterns on semiconductor substrates with high accuracy by using the transfer masks of the present invention.

The mask blank of the invention, in which a tantalum-containing material is used for the pattern-forming thin film, can suppress the thin film from having a tendency of the film stress to become more compressive with the passage of time. Thus, the mask blank obtainable according to the invention can suppress its flatness from becoming deteriorated with the passage of time after production. Accordingly, the mask blank of the present invention can maintain a film stress level of the thin film as produced. The use of the mask blank of the present invention allows for the suppression of a large displacement of a pattern which can be encountered when a transfer mask is fabricated from a mask blank having a high stress thin film. When a transfer mask is fabricated from the mask blank produced by a process according to the present invention, the transfer mask can also suppress the occurrence of a displacement of the pattern with the passage of time after fabrication. Because the transfer mask of the present invention suppresses the flatness of the main surfaces from becoming deteriorated due to the film stress of the thin film and further suppresses the occurrence of a displacement of the pattern formed in the thin film, the transfer mask allows the transfer pattern to be transferred accurately to a resist film on a semiconductor substrate. In this manner, it is possible to manufacture semiconductor devices having fine circuit patterns on semiconductor substrates with high accuracy.

DETAILED DESCRIPTION OF THE INVENTION

Figure 1:
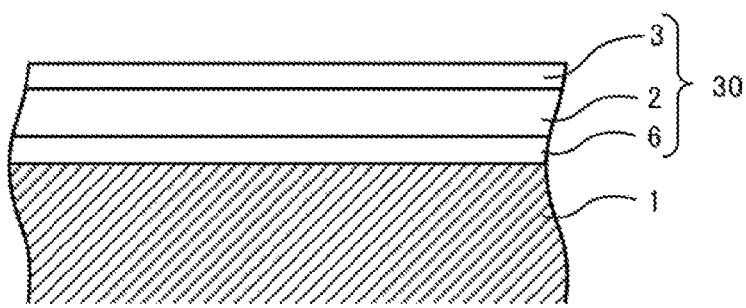
FIG. 1 is a cross sectional view illustrating a configuration of a mask blank according to an embodiment of the present invention.

First, the configurations 1 to 9 of a mask blank of the invention will be described.

An aspect of the invention is directed to a mask blank described in the configuration 1 including a glass substrate and a thin film formed above a main surface of the glass substrate, wherein the thin film comprises a material containing tantalum and substantially no hydrogen, and the mask blank has a invasion suppressive film between the main surface of the glass substrate, and the invasion suppressive film suppresses hydrogen from being invaded from the glass substrate into the thin film.

The mask blank with the configuration 1 solves the problem of the tendency of the film stress of the thin film to become more compressive with the passage of time, and suppresses deterioration in flatness.

As described in the configuration 2, it is preferable in the mask blank of the present invention that the invasion suppressive film comprises a material containing tantalum and oxygen.

When the invasion suppressive film includes a material containing tantalum and oxygen as in the configuration 2, the permeation of hydrogen through the invasion suppressive film can be reduced. Thus, the invasion of hydrogen from the glass substrate into the thin film can be suppressed more reliably. As a result, the mask blank is enhanced in terms of the ability of suppressing deterioration in flatness.

As described in the configuration 3, it is preferable in the mask blank of the present invention that the invasion suppressive film contains oxygen at not less than 50 at % (atomic %).

When the invasion suppressive film contains oxygen at not less than 50 at % as described in the configuration 3, the proportion of tantalum which is not bonded to oxygen becomes very small and the permeation of hydrogen through the invasion suppressive film can be further reduced. Thus, the invasion of hydrogen from the glass substrate into the thin film can be suppressed even more reliably. As a result, the mask blank is further enhanced in terms of the ability of suppressing deterioration in flatness.

As described in the configuration 4, it is preferable in the mask blank of the present invention that the invasion suppressive film is formed in contact with the main surface of the glass substrate on the side where the thin film is formed.

The direct contact of the invasion suppressive film with the glass substrate according to the configuration 4 allows for the confinement of hydrogen within the glass substrate. Thus, the invasion of hydrogen from the glass substrate into the thin film can be suppressed reliably.

As described in the configuration 5, it is preferable in the mask blank of the present invention that the main surface of the glass substrate on the side where the thin film is formed has a surface roughness of not more than 0.2 nmRq.

To achieve a surface roughness of not more than 0.2 nmRq on the main surface of the glass substrate on the side where the thin film is formed as described in the configuration 5, it is necessary for the glass substrate to be polished by a specific method. Such a polishing step for the glass substrate needs to use polishing liquid containing water as a solvent, and washing with an aqueous cleaning liquid is necessarily after the polishing. Thus, polishing the glass substrate to a surface roughness of the main surface of not more than 0.2 nmRq results in the incorporation of hydroxyl hydrogen into the glass substrate. According to the mask blank of the invention, the diffusion of hydrogen from the glass substrate into the thin film can be suppressed even if the glass substrate has been polished to a prescribed surface roughness by a specific method.

As described in the configuration 6, it is preferable in the mask blank of the present invention that the thin film comprises a material which contains tantalum and nitrogen and does not substantially contain hydrogen.

When the thin film contains tantalum and nitrogen as described in the configuration 6, the thin film can obtain a high optical density. Such a thin film can be favorably used as a light shielding layer in a transfer mask. By allowing tantalum to combine with nitrogen, the tantalum in the thin film can be suppressed from oxidation. Because the thin film includes a material which does not substantially contain hydrogen, it is possible to further suppress the tendency of the film stress of the thin film to become more compressive with the passage of time.

As described in the configuration 7, it is preferable in the mask blank of the present invention that a highly oxidized layer containing oxygen at not less than 60 at % is formed as a surface layer of the thin film.

By forming a highly oxidized layer containing oxygen at not less than 60 at % as a surface layer of the thin film as described in the configuration 7, it is possible to prevent atmospheric hydrogen from being invaded into the thin film. This is because of the fact that there is little tantalum which is not bonded to oxygen in the highly oxidized layer and consequently the permeation of hydrogen through the surface layer of the thin film can be reduced. Further, the highly oxidized layer itself has high durability because it has a high proportion of the content of tantalum oxide in a more stable bonding state and exhibits excellent chemical resistance, hot water resistance and ArF light resistance. Thus, a transfer mask fabricated from the mask blank of the present invention can achieve higher flatness.

As described in the configuration 8, it is preferable in the mask blank of the present invention that the thin film have a structure in which a lower layer and an upper layer are laminated in this order from the glass substrate side, the lower layer comprises a material which contains tantalum and nitrogen and does not substantially contain hydrogen, and the upper layer comprises a material which contains tantalum and oxygen.

By configuring the mask blank such that it has a structure in which a specific lower layer and a specific upper layer are stacked together as described in the configuration 8, the upper layer can function as a film (an antireflection film) that has a function of controlling the surface reflectance of the thin film with respect to exposure light.

As described in the configuration 9, it is preferable in the mask blank of the present invention that a highly oxidized layer containing oxygen at not less than 60 at % is formed as a surface layer of the upper layer.

By forming a highly oxidized layer containing oxygen at not less than 60 at % as a surface layer of the upper layer as described in the configuration 9, it is possible to prevent atmospheric hydrogen from being invaded into the thin film. This is caused by the fact that there is little tantalum which is not bonded to oxygen in the highly oxidized layer and consequently the permeation of hydrogen through the surface layer of the thin film can be reduced. Further, the highly oxidized layer itself has high durability because it has a high proportion of the content of tantalum oxide in a more stable bonding state and has excellent chemical resistance, hot water resistance and ArF light resistance. Thus, a transfer mask fabricated from the mask blank of the present invention can achieve higher flatness.

Another aspect of the invention is directed to a transfer mask described in the configuration 10, in which a transfer pattern is formed in the thin film of the mask blank described in any one of the configurations 1 to 9. Because the flatness of the mask blank of the present invention is maintained at a desired high level, the transfer mask that is produced using the mask blank having such characteristics also can achieve a desired high level of flatness.

Another aspect of the invention described in the configuration 11 is directed to a process for manufacturing semiconductor devices using the transfer mask described in the configuration 10, wherein the process comprises transferring the transfer pattern of the transfer mask to a resist film on a semiconductor substrate by exposing the resist film through the transfer mask. By exposing a resist film on a semiconductor substrate through the transfer mask of the present invention to transfer the transfer pattern to the resist film, a semiconductor device having a pattern with high accuracy can be manufactured.

Next, embodiments of the invention will be described.

The present inventor has studied reasons for the increase in compressive stress with the passage of time which occurs in a tantalum-containing thin film immediately after it is formed on a glass substrate. To examine whether the increase was caused by a manner of storing mask blanks after film production, various storage cases and storage methods were first investigated. However, the flatness of the main surfaces of the mask blanks was deteriorated in all cases and a clear correlation was not obtained. Next, the mask blanks whose main surfaces had been deteriorated in flatness and had become convex were subjected to a heat treatment using a hot plate at 200° C. for about 5 minutes. This heat treatment temporarily remedied and improved the convex shape of the main surfaces slightly. However, the flatness of the main surfaces of the mask blank restarted to be deteriorated with the passage of time after the heat treatment. Thus, this approach was shown not to lead to a fundamental solution.

Next, the present inventor studied the possibility of the involvement of easy hydrogen incorporation characteristics of tantalum-containing materials. That is, the present inventor made a hypothesis that hydrogen would be gradually incorporated into a tantalum-containing thin film with the passage of time to increase compressive stress. In view of existing knowledge, however, any factors that would cause hydrogen to be incorporated were not seen for the mask blanks which had increased compressive stress during the passage of time. The substrates used in these mask blanks were formed of synthetic quartz glass, which had been cut out from a synthetic quartz ingot prepared by a process controlled such that the ingot would not contain hydrogen. Further, the tantalum-containing thin film had a structure in which a lower layer that included a material containing tantalum and nitrogen was stacked on the main surface of the substrate and an upper layer that included a material containing oxidized tantalum was stacked on the lower layer. Because films that included a material containing oxidized tantalum were effective in suppressing the invasion of hydrogen from outside air, the invasion of atmospheric hydrogen into the tantalum-containing thin film had been considered unlikely.

The following examination was carried out to confirm whether hydrogen would be incorporated into a tantalum-containing thin film during the passage of time after the completion of film production. In detail, two kinds of mask blanks that were provided with a thin film including a tantalum-containing material were each analyzed to measure the film composition. One of the two kinds of mask blanks was a relatively new mask blank that had been housed in a case for about 2 weeks after film production and had no deterioration in terms of the flatness of the thin film. The other of the two kinds of mask blanks was a mask blank which had been housed in a case for 4 months after film production and in which the thin film had increased compressive stress to deteriorate flatness (the change in flatness was about 300 nm in terms of Coordinate TIR flatness with respect to a region inside a 142 mm square about the center of the main surface of the substrate). For the analysis of the films, HFS/RBS analysis (hydrogen forward scattering analysis/Rutherford backscattering analysis) was used. The results showed that the hydrogen content was not more than the lower detection limit in the thin film stored for about 2 weeks after film production, while the thin film stored for 4 months after film production contained hydrogen at approximately 6 at %.

These results confirmed that a change in film stress was caused by the incorporation of hydrogen into a tantalum-containing thin film after film production. Next, the present inventor suspected a substrate as a source of the generation of hydrogen. A glass substrate was polished until the flatness and surface roughness of the main surfaces became at least the level required for mask blank substrates, and thereafter a invasion suppressive film was formed on the glass substrate to suppress the invasion of hydrogen from the glass substrate into a thin film. Subsequently, a thin film comprising a tantalum-containing material was formed. Mask blanks produced in this manner were analyzed similarly as described above. The results showed that the mask blank which had the glass substrate with the invasion suppressive film exhibited a small deterioration in flatness and the thin film had been suppressed from containing hydrogen even after the passage of 4 months after film production.

The following possibilities probably explain the reasons why sources which generate hydrogen such as OH groups, hydrogen and water come to be present in a glass substrate for a mask blank that is produced using a glass ingot formed by a process in which the contamination of OH groups and hydrogen is unlikely to occur.

In general, mask blank substrates are required to meet strict levels of flatness and surface roughness on their main surfaces. It is therefore difficult for a glass substrate as cut out from a glass ingot into its shape to satisfy such requirements for glass substrates for mask blanks. Thus, a glass substrate as cut out needs to be subjected to multistage grinding steps and polishing steps to give high flatness and high surface roughness to the main surfaces. A polishing liquid used in the polishing step contains colloidal silica abrasive particles as an abrasive agent. Such colloidal silica abrasive particles easily become attached onto the substrate surface. Thus, during or after the multistage polishing steps, the substrate is usually washed with a cleaning liquid containing hydrofluoric acid or hydrofluorosilicic acid which has an etching effect on the substrate surface.

In the grinding steps and the polishing steps, an affected layer is easily formed as a surface layer of the substrate. Hydroxy (OH) groups and hydrogen may be possibly incorporated into this affected layer. Further, it is probable that the OH groups and the hydrogen diffuse from the affected layer into the inside of the substrate. The incorporation of OH groups and hydrogen possibly takes place when the surface of the substrate is finely etched during washing performed, for example, between polishing steps. Further, another possibility is that a hydrated layer is formed on the surface of the glass substrate.

The present invention has been made in view of the aforementioned considerations. That is, the mask blank of the invention includes a glass substrate and a thin film formed above a main surface of the glass substrate, and is characterized in that the thin film includes a material containing tantalum and substantially no hydrogen, and the mask blank has a invasion suppressive film between the main surface of the glass substrate and the thin film which suppresses hydrogen from being invaded from the glass substrate into the thin film.

The mask blank of the invention has the invasion suppressive film between the main surface of the glass substrate and the tantalum-containing thin film which suppresses hydrogen from being invaded from the glass substrate into the thin film. With this configuration, hydrogen can be suppressed from being incorporated into the tantalum-containing thin film, and consequently the increase in the compressive stress in the thin film can be suppressed.

Figure 7:
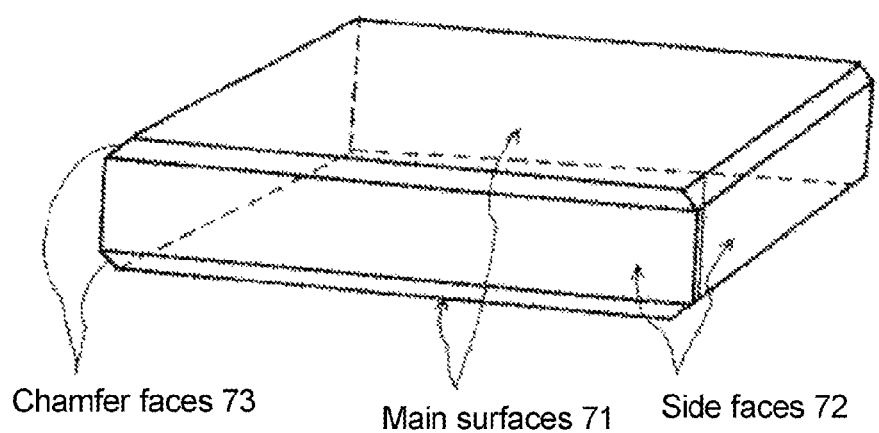
FIG. 7 is a schematic view illustrating a glass substrate usable in a mask blank of the present invention.

The mask blank of the present invention has a structure in which the thin film is formed above the main surface of the glass substrate. In some embodiments of the mask blank of the present invention, the thin film is formed not only on the main surface of the glass substrate but also on a chamfer face adjacent to the main surface. Further, in some embodiments, the thin film is also formed above at least a portion of a side face adjacent to the chamfer face. The term "main surfaces" of the glass substrate refers to surfaces except peripheries (side faces 72 and chamfer faces 73) of the substrate as illustrated in FIG. 7. That is, the term "main surfaces" of the glass substrate refers to two opposed "main surfaces 71" illustrated in FIG. 7.

It is desirable that the glass substrate used in the mask blank of the present invention is mirror polished on the main surfaces such that the flatness in a region inside a 142 mm square about the center of the main surface of the glass substrate (hereinafter, referred to as 142 mm square inner region) after mirror polishing is not more than 0.5 μm and the surface roughness in a region inside a 1 μm square in Rq (root mean square roughness) is not more than 0.2 nm (hereinafter simply referred to as nmRq). More desirably, the flatness in a 132 mm square inner region on the main surface of the glass substrate is not more than 0.3 μm. A glass substrate as cut out from a glass ingot cannot satisfy these severe flatness and surface roughness conditions. To satisfy such severe flatness and surface roughness conditions, performing mirror polishing at least on the main surface of the glass substrate is essential. This mirror polishing is preferably carried out in such a manner that both main surfaces of the glass substrate are polished simultaneously by double surface polishing using a polishing liquid containing colloidal silica polishing abrasive particles. Further, it is desirable that a glass substrate as cut out is subjected to multistage grinding steps and polishing steps to form final main surfaces meeting desired levels of flatness and surface roughness. In this case, a polishing liquid containing colloidal silica polishing abrasive particles is used at least in the final stage of the polishing step.

Exemplary materials for the glass substrate used in the mask blank of the present invention include synthetic quartz glass as well as quartz glass, aluminosilicate glass, soda lime glass and low thermal expansion glass (such as $SiO_2$—$TiO_2$ glass). In particular, synthetic quartz glass is preferably used as the material for the glass substrate because synthetic quartz glass has a high transmittance to ArF excimer laser light (wavelength 193 nm). The exposure light applied to the mask blank and the transfer mask of the invention is not particularly limited, and examples thereof include ArF excimer laser light, KrF excimer laser light and i-line light. Mask blanks and transfer masks that will be irradiated with ArF excimer laser light as exposure light are required to meet very high levels in the flatness of the main surfaces as well as the position accuracy of transfer patterns formed in thin films. Thus, the mask blank and the transfer mask of the invention are particularly effectively used in order to adopt ArF excimer laser light as exposure light.

After the glass substrate which has been mirror polished on the main surfaces is prepared, the glass substrate may be subjected to a heat treatment to forcibly expel hydrogen sources such as OH groups, hydrogen and water incorporated in the surface layer or the inside of the glass substrate. In the heat treatment, the glass substrate is preferably heated to 300° C. or more. Any heat treatment at less than 300° C. does not raise the temperature sufficiently and does not expel hydrogen in the substrate to the outside of the substrate with sufficiently effective extent. The heat treatment is more effective when the temperature is 400° C. or more. When the temperature is 500° C. or more, sufficient effects can be obtained in expelling hydrogen outside the substrate even if the heating time is shortened. On the other hand, the heat treatment needs to be performed at below 1600° C. The reason for this is because the softening point of synthetic quartz is generally around 1600° C., and heating at 1600° C. or above causes the substrate to be softened and deformed. The heat treatment is preferably carried out at not more than 1000° C., and more desirably not more than 800° C. The treatment time of the heat treatment for the glass substrate depends on the heating temperature, but is desirably at least not less than 10 minutes. The treatment time of the heat treatment for the glass substrate is preferably not less than 30 minutes, and more preferably not less than 40 minutes.

The heat treatment is preferably carried out with a gas in which hydrogen has been removed as much as possible and the gas is present around the glass substrate. Although the amount of hydrogen itself is small in air, air contains much vapor. Even humidity of air in a clean room is controlled, the air contains a relatively large amount of vapor. By heat treating the glass substrate in dry air, the invasion of vapor-origin hydrogen into the glass substrate can be suppressed. More preferably, the glass substrate is heat treated in a gas containing no hydrogen and no vapor (for example, in an inert gas such as nitrogen, or in a noble gas).

When the heat treatment is performed, the glass substrate is desirably washed by a specific washing step. If the heat treatment is carried out with the polishing abrasive particles used in the polishing step attached to the substrate, these particles adhere to the surface of the substrate and often cannot be removed even if a usual washing step is performed after the heat treatment. In particular, such a material as colloidal silica which is analogous to the glass substrate can possibly adhere strongly to the surface of the glass substrate. Thus, the glass substrate is desirably washed with a washing liquid that contains hydrofluoric acid or hydrofluorosilicic acid having an etching effect on the substrate surface. In washing the substrate surface, it is possible to adopt a washing liquid that contains sodium hydroxide or potassium hydroxide having an effect of finely etching the substrate surface.

The mask blank of the invention is characterized in that the mask blank has the invasion suppressive film between the main surface of the glass substrate and the thin film. The invasion suppressive film suppresses hydrogen from being invaded from the glass substrate into the thin film. The invasion suppressive film allows the mask blank of the present invention to suppress the invasion of hydrogen from the glass substrate into the thin film. As a result, the mask blank further suppresses deterioration in flatness.

Any material may be used for the invasion suppressive film as long as it is hardly permeable to hydrogen and can suppress the invasion of hydrogen from the glass substrate into the thin film. To suppress the invasion of hydrogen from the glass substrate into the thin film more reliably, the invasion suppressive film preferably includes a material containing tantalum and oxygen.

To prevent the invasion of hydrogen from the glass substrate into the thin film even more reliably, the invasion suppressive film preferably contains oxygen at not less than 50 at %. The thin films in the mask blank and those in the transfer mask desirably have a microcrystalline structure, and preferably an amorphous structure. In such a thin film, the crystal structure in the thin film will not be a single structure and tends to be a mixture of a plurality of crystal structures. Thus, the invasion suppressive film tends to form a structure in which tantalum with no bonding to oxygen, TaO bonds, $Ta_2O_3$ bonds, $TaO_2$ bonds and $Ta_2O_5$ bonds are mixed (a mixed crystal). The hydrogen incorporation as well as the passage of hydrogen through the film is facilitated with increasing proportion of tantalum with no bonding to oxygen in the film. Theoretically, adding not less than 50 at % of oxygen to the invasion suppressive film allows all the tantalum atoms in the film to bond to oxygen. Further, with this oxygen content, it is considered that it is possible to lower the proportion of tantalum with no bonding to oxygen to a markedly low level even in a mixed crystal such as one described above.

In the invasion suppressive film containing tantalum and oxygen, it is considered that the bonding states between tantalum and oxygen in the film tend to be mainly $Ta_2O_3$ bonds when the oxygen content in the film is 60 at % to less than 66.7 at %. When the oxygen content in the film is in this range, the proportion of TaO bonds, which are the most unstable bonds, is considered to be markedly lower than it would be when the oxygen content in the film is less than 60 at %. Further, the above oxygen content will not allow the presence of tantalum with no bonding to oxygen. When the oxygen content in the invasion suppressive film is 66.7 at % or more, it is considered that the bonding states between tantalum and oxygen in the film tend to be mainly $TaO_2$ bonds. When the oxygen content in the film is in this range, the proportions of the most unstable TaO bonds and the second most instable $Ta_2O_3$ bonds are both considered to be very low.

When the oxygen content in the invasion suppressive film is 68 at % or more, it is considered that not only $TaO_2$ becomes the main bonding state but also the proportion of the $Ta_2O_5$ bonding state is increased. With this oxygen content, the "$Ta_2O_3$" and "$TaO_2$" bonding states are rarely present and the "TaO" bonding state is hardly present. When the oxygen content in the invasion suppressive film is 71.4 at %, it is considered that the film is substantially formed by the $Ta_2O_5$ bonding state alone. Thus, the lower limit of the oxygen content in the film is preferably 50 at %, and more preferably 60 at %.

Because the $Ta_2O_5$ bond is a bonding state having a very high stability, increasing the proportion of $Ta_2O_5$ bonds present in the invasion suppressive film results in marked improvements in mask washing resistance such as chemical resistance and hot water resistance as well as ArF light resistance. With such high resistances of the invasion suppressive film, the ability of suppressing hydrogen invasion can be suppressed from being lowered. In particular, it is the most preferable that the invasion suppressive film be formed of the $Ta_2O_5$ bonding state alone. The contents of nitrogen and other elements in the invasion suppressive film are preferably such that the functions and effects such as the ability of suppressing hydrogen invasion are not adversely affected. Preferably, such elements are substantially absent from the film.

When the invasion suppressive film is formed of a material containing tantalum and oxygen, the material is preferably selected such that XPS analysis (X-ray photoelectron spectroscopy) of the invasion suppressive film gives a Ta 4f narrow spectrum in which the maximum peak appears at a binding energy of not less than 25 eV. The invasion suppressive film having such physical properties has a high proportion of $Ta_2O_5$ bonds in the film and can not take in hydrogen very much, thus achieving a higher effect in suppressing the invasion of hydrogen from the glass substrate into the thin film including a tantalum-containing material.

The thickness of the invasion suppressive film is preferably not less than 2 nm, and more preferably not less than 3 nm. If the thickness of the invasion suppressive film is less than 2 nm, the invasion suppressive film is so thin that the effect of the suppression of hydrogen invasion cannot be expected. Further, any thickness of the invasion suppressive film that is less than 2 nm incurs difficulties in forming the film with a substantially uniform thickness and a substantially uniform film composition on the main surface of the substrate even by a sputtering method. The thickness of the invasion suppressive film is preferably not more than 10 nm, and more preferably not more than 8 nm. Because the invasion suppressive film is a thin film containing oxygen, it has a low optical density to ArF exposure light. If the thickness of the invasion suppressive film exceeds 10 nm, there is a risk that the total thickness of the stacked structure including the invasion suppressive film and the thin film will be excessively large (for example, a total thickness exceeding 60 nm), possibly adversely affecting the performance of the transfer mask.

Alternatively, the invasion suppressive film may be formed of a material containing silicon and oxygen. In this case, the metal content in the invasion suppressive film is preferably not more than 5 at %, more preferably not more than 1 at %, and still more preferably no metals contained. In the invasion suppressive film formed of a material containing silicon and oxygen, the ratio between silicon and oxygen in the material is preferably 1:1 to 1:2. If the proportion of oxygen in the material is smaller than that of silicon, more silicon will be present without forming bonds with oxygen, thus lowering the effect of the suppression of hydrogen invasion. Exemplary materials that contain silicon and oxygen and do not contain metals include $Si_xO_y$, $Si_xO_yN_z$, $Si_xO_yC_w$, $Si_xO_yC_wN_z$, $Si_xO_yB_v$, and $Si_xO_yB_vN_z$.

In the mask blank that is provided with the invasion suppressive film including a material containing silicon and oxygen, this mask blank may be fabricated into a transfer mask without forming a transfer pattern in the invasion suppressive film. In this case, the invasion suppressive film will be present also in a light-transmitting section where the pattern-forming thin film is not present in the transfer mask. Thus, it is necessary that the invasion suppressive film have high transmittance to ArF excimer laser light. The invasion suppressive film in this case is preferably formed of $Si_xO_y$ or $Si_xO_yN_z$, more preferably $Si_xO_y$, and particularly preferably $SiO_2$.

In the invasion suppressive film that includes a material containing silicon and oxygen, the thickness of the film needs to be not less than 5 nm, and more preferably not less than 10 nm. If the thickness of the invasion suppressive film is less than 5 nm, the invasion suppressive film is so thin that the effect of the suppression of hydrogen invasion cannot be expected. The thickness of the invasion suppressive film that includes a material containing silicon and oxygen is preferably not more than 50 nm, and more preferably not more than 30 nm. The invasion suppressive film that includes a material containing silicon and oxygen is desirably formed by a sputtering method. When the invasion suppressive film that includes a material containing silicon and oxygen is formed by a sputtering method, a defect easily occurs in the formed invasion suppressive film because a sputtering target has low conductivity. When this point is considered, it is preferable that the invasion suppressive film be formed by an RF sputtering method or an ion beam sputtering method.

In the mask blank of the invention, it is preferable that the invasion suppressive film is formed in contact with the main surface of the glass substrate on the side where the thin film is to be formed. By forming the invasion suppressive film in contact with the main surface of the glass substrate on the side where the thin film is to be formed, hydrogen can be confined within the glass substrate. Thus, the invasion of hydrogen from the glass substrate into the thin film can be suppressed reliably.

The thin film of the mask blank of the present invention includes a material containing tantalum and substantially no hydrogen. By containing tantalum, the thin film can favorably work as a light shielding layer in a transfer mask which has high optical density.

Tantalum becomes brittle upon incorporating hydrogen. Because of this characteristic, it is desired that hydrogen content in the thin film is suppressed even immediately after the thin film comprising a material containing tantalum is formed. Thus, in the mask blank of the present invention, a material containing tantalum and substantially no hydrogen is selected for the thin film formed above the main surface of the glass substrate. The phrase "containing substantially no hydrogen" or "do(es) not substantially contain hydrogen" means at least that the hydrogen content in the thin film is not more than 5 at %. The hydrogen content in the thin film is preferably not more than 3 at %, and more preferably not more than the lower detection limit. For the same reason, the step of forming the thin film during the production of the mask blank of the present invention is preferably carried out in such a manner that the glass substrate is placed in a film formation chamber and the thin film is formed by sputtering with a tantalum-containing target onto the main surface of the glass substrate while introducing a hydrogen-free sputtering gas into the film formation chamber.

Exemplary materials containing tantalum and substantially no hydrogen that may be used to form the thin film on the glass substrate include tantalum metal and materials that contain tantalum and one or more elements selected from nitrogen, oxygen, boron and carbon and do not substantially contain hydrogen. Examples of the materials containing tantalum and substantially no hydrogen include Ta, TaN, TaON, TaBN, TaBON, TaCN, TaCON, TaBCN and TaBOCN. These materials may contain metals other than tantalum with a content range that still achieves the advantageous effects of the invention.

The thin film in the mask blank of the present invention is preferably characterized in that it includes a material that contains tantalum and nitrogen and does not substantially contain hydrogen. By including nitride in tantalum, the tantalum in the thin film can be suppressed from oxidation. Tantalum is a material that tends to be naturally oxidized. Excessive oxidation of tantalum results in a decrease in light shielding performance (optical density) with respect to exposure light. The thin film comprising the material with substantial absence of hydrogen allows for further suppression of the tendency of the film stress of the thin film to become more compressive with the passage of time.

From the viewpoint of optical density, the nitrogen content in the thin film is preferably not more than 30 at %, more preferably not more than 25 at %, and still more preferably not more than 20 at %. On the other hand, the nitrogen content in the thin film is desirably not less than 5 at %. It can be said that a material in which the oxidation of tantalum has not proceeded can be dry etched with any of etching gases containing fluorine (fluorine-based etching gases) and etching gases containing chlorine and no oxygen (oxygen-free chlorine-based etching gases). In terms of the formation of a thin film pattern, it can also be said that the deep oxidation of tantalum results in a material which is hard to dry etch with an oxygen-free chlorine-based etching gas and which can be dry etched only with a fluorine-based etching gas. By including nitride in tantalum, the oxidation of tantalum can be suppressed.

Some metals other than tantalum also have a tendency to incorporate hydrogen. Advantageous effects similar to those of the present invention can be obtained even when tantalum in the material for the thin film is replaced by another metal easily incorporating hydrogen. Examples of such other metals having the tendency to incorporate hydrogen include niobium, vanadium, titanium, magnesium, lanthanum, zirconium, scandium, yttrium, lithium and praseodymium. Further, similar effects are obtained with an alloy formed by tantalum and two or more metals selected from these metals having the tendency to incorporate hydrogen. Even when the thin film is formed above the glass substrate using a material containing any of these metals and alloys, it is effective to insert the invasion suppressive film between the thin film and the glass substrate.

If the thin film including a tantalum-containing material is formed in contact with the main surface of the glass substrate, such a configuration permits hydrogen and other undesired materials present in the glass substrate to be incorporated directly into the thin film. To avoid this configuration, the mask blank is provided with the invasion suppressive film, whereby a more marked effect can be obtained in the suppression of the invasion of hydrogen sources such as OH groups, hydrogen and water from the glass substrate into the thin film.

Regarding the thin film in the mask blank of the invention, it is preferable that a highly oxidized layer containing oxygen at not less than 60 at % be formed as a surface layer of the thin film (a surface layer of the thin film on the side opposite to the main surface of the substrate, namely, a surface layer of the thin film on the side opposite to the invasion suppressive film). As described hereinabove, not only hydrogen in the substrate but also hydrogen in a gas surrounding the mask blank can be incorporated into the thin film through the substrate and the surface of the thin film, respectively. Similarly to the invasion suppressive film, this covering of the highly oxidized thin film material can not have tantalum metal with no bonding, and thus blocks the invasion of hydrogen into the thin film. Further, the highly oxidized layer of the tantalum-containing material (the highly oxidized tantalum layer) also exhibits excellent chemical resistance, hot water resistance and light resistance to ArF exposure light. This high durability of the highly oxidized layer allows for maintaining the ability to suppress hydrogen invasion at a high level.

Similarly to the highly oxidized tantalum film usable as the invasion suppressive film, the highly oxidized tantalum layer tends to be a mixture of TaO bonds, $Ta_2O_3$ bonds, $TaO_2$ bonds and $Ta_2O_5$ bonds. The specific surface layer in the light shielding film tends to be increased in chemical resistance, hot water resistance and ArF light resistance as the proportion of $Ta_2O_5$ bonds increases and tends to be lowered in these properties as the proportion of TaO bonds increases. Further, similarly to the highly oxidized tantalum film, the highly oxidized tantalum layer has variable bonding states between tantalum and oxygen in the layer depending on the oxygen content in the layer. That is, when the oxygen content is 60 at % or more, the highly oxidized tantalum layer comes to contain not only "$Ta_2O_5$" that is the most stable bonding state but also "$Ta_2O_3$" and "$TaO_2$" bonding states. Further, when oxygen content in the layer is not less than 60 at %, the content of at least TaO bonds that are the most unstable bonds, becomes a very small amount that chemical resistance and ArF light resistance will not be adversely affected. Thus, it is considered preferable that the lower limit of the oxygen content in the layer be 60 at %. When the oxygen content in the highly oxidized tantalum layer is 68 at % or more, it is considered that not only $TaO_2$ becomes the main bonding state but also the proportion of the $Ta_2O_5$ bonding state is increased. Thus, the lower limit of the oxygen content in the layer is preferably 68 at %, and more preferably 71.4 at %.

The proportion of the $Ta_2O_5$ bonds in the highly oxidized tantalum layer is desirably higher than the proportion of the $Ta_2O_5$ bonds in the thin film except the highly oxidized layer. Because the $Ta_2O_5$ bond is a bonding state having a very high stability, increasing the proportion of the $Ta_2O_5$ bonds present in the highly oxidized layer results in marked improvements in mask washing resistance such as chemical resistance and hot water resistance as well as ArF light resistance. In particular, it is the most preferable that the highly oxidized tantalum layer be formed of the $Ta_2O_5$ bonding state alone. The contents of nitrogen and other elements in the highly oxidized tantalum layer are preferably such that the functions and effects such as the ability of suppressing hydrogen invasion are not adversely affected. Preferably, such elements, nitrogen and other elements, are substantially absent from the layer.

The highly oxidized tantalum layer is preferably formed of such a material that XPS analysis (X-ray photoelectron spectroscopy) gives a Ta 4f narrow spectrum in which the maximum peak appears at a binding energy of not less than 25 eV. The highly oxidized tantalum layer having such physical properties has a very high proportion of $Ta_2O_5$ bonds present in the layer and is less prone to take in hydrogen, thus achieving a higher effect in suppressing hydrogen invasion.

The thickness of the highly oxidized tantalum layer is preferably 2 nm to 4 nm. If the thickness is less than 2 nm, the layer is so thin that the effect of the suppression of hydrogen invasion cannot be expected. Because the highly oxidized tantalum layer has a very low optical density to ArF exposure light, any thickness of the highly oxidized tantalum layer exceeding 4 nm works negatively from the viewpoint of reducing the thickness of the thin film. In consideration of the balance between ensuring an optical density of the entire thin film and improving the ability to suppress hydrogen invasion as well as chemical resistance and ArF light resistance, the thickness of the highly oxidized layer is more desirably 2 nm to 3 nm.

For example, the highly oxidized tantalum layer may be formed by subjecting the mask blank in which the thin film has been formed to a hot water treatment, an ozone-containing water treatment, a heat treatment in an oxygen-containing gas, a UV irradiation treatment in an oxygen-containing gas, and/or an $O_2$ plasma treatment. The highly oxidized layer is not limited to a highly oxidized layer of the metal forming the thin film. A highly oxidized layer of any metal may be used as long as the layer can block hydrogen invasion, and the configuration may be such that such a highly oxidized layer is stacked on the surface of the thin film. Further, the material is not limited to a highly oxidized material as long as the material can block the invasion of hydrogen into the thin film, and the configuration may be such that such a material layer, which blocks the invasion of hydrogen, is stacked on the surface of the thin film.

In the mask blank of the invention, it is preferable that the thin film has a structure in which a lower layer and an upper layer are laminated in this order from the glass substrate side, the lower layer include a material which contains tantalum and nitrogen and does not substantially contain hydrogen, and the upper layer include a material which contains tantalum and oxygen. With this configuration, the upper layer can function as a film (an antireflection film) that has a function of controlling the surface reflectance of the thin film with respect to exposure light.

In the mask blank of the present invention, it is preferable that a highly oxidized layer containing oxygen at not less than 60 at % is formed as a surface layer of the upper layer.

The configurations, functions and effects of the highly oxidized layer or any other layer formed as a surface layer of the upper layer are similar to those described hereinabove. In consideration of easiness in controlling surface reflectance properties (reflectance to ArF exposure light and reflectance spectra to respective wavelength lights) of the upper layer, it is preferable that the oxygen content in the upper layer except the surface layer portion is less than 60 at %.

The upper layer is preferably formed of a material containing tantalum and oxygen. In terms of the formation of a thin film pattern, dry etching of the upper layer (formed of a material containing tantalum and oxygen) is difficult with an oxygen-free chlorine-based etching gas and is possible only with a fluorine-based etching gas. In contrast, the lower layer is formed of a material containing tantalum and nitrogen. In terms of the formation of a thin film pattern, dry etching of the lower layer (formed of a material containing tantalum and nitrogen) is possible with any of a fluorine-based etching gas and an oxygen-free chlorine-based etching gas. Thus, when the thin film may be dry etched to form a pattern through a resist pattern (a resist film in which a transfer pattern is formed) as a mask, a certain process can be used. The certain process that can be used is that the upper layer is dry etched with a fluorine-based etching gas to form a pattern, and the lower layer is dry etched with an oxygen-free chlorine-based etching gas to form a pattern using the upper layer pattern as a mask. The applicability of such an etching process allows for the thickness reduction of a resist film.

The resistance of the upper layer to dry etching with an oxygen-free chlorine-based etching gas may be appropriately increased by increasing the content of tantalum-oxygen bonds in the upper layer which have a relatively high bonding energy. To make the upper layer more resistant to dry etching, it is preferable that the ratio of the oxygen content to the tantalum content in the upper layer is not less than 1. When the upper layer is formed of tantalum and oxygen alone, the oxygen content in the upper layer is preferably not less than 50 at %.

The material for forming the lower layer in the thin film in the mask blank may be similar to the aforementioned material containing tantalum and substantially no hydrogen. The material for forming the upper layer is preferably one containing tantalum, oxygen and one or more other elements such as nitrogen, boron and carbon. Examples of the materials forming the upper layer include TaO, TaON, TaBO, TaBON, TaCO, TaCON, TaBCO and TaBOCN.

The thin film in the mask blank is not limited to the above-described stacked structure. The thin film in the mask blank may be a single composition gradient film or may be a film structure in which the compositions are graded between an upper layer and a lower layer. When the mask blank is fabricated into a transfer mask, the thin film in the mask blank is desirably used as a light shielding film functioning as a light shielding pattern. However, the purpose of the use of the thin film is not limited thereto. Within constraints required for thin films, the thin film in the mask blank may be used also as a half tone phase shift film or a light-semi-transmitting film. Meanwhile, the mask blank of the invention can suppress a change toward higher compressive stress in the thin film with the passage of time. Thus, the mask blanks of the invention can be particularly suitably used in the fabrication of a transfer mask set that will be subjected to double patterning techniques (such as double patterning technique [Dtechnique] in a narrow sense, and double exposure technique [DE technique]) which require for thin film patterns to have high position accuracy.

In the thin film in the mask blank, an etching stopper film or an etching mask film may be formed between the glass substrate and the thin film. This film may include a material having etching selectivity different from those of both the glass substrate and the thin film (a chromium-containing material such as Cr, CrN, CrC, CrO, CrON or CrC). Further, it is possible to form, between the glass substrate and the thin film, a half tone phase shift film having a specific phase shift effect and a specific transmittance to exposure light, or a light-semi-transmitting film having a specific transmittance to exposure light. (In this case, the thin film is used as a light shielding film for forming a light shielding band, a light shielding patch or the like.) It is however necessary that these films provided in contact with the thin film in the mask blank is basically formed of a hydrogen-free material (to which hydrogen has not been actively added and for which the treatments until the formation of the thin film in the mask blank are controlled such that the incorporation of hydrogen is minimally suppressed). In this case too, the invasion suppressive film is preferably formed in contact with the main surface of the glass substrate. Alternatively, when any of these films can function to suppress hydrogen incorporation, the invasion suppressive film may be arranged between the thin film and any of these films in the mask blank. In some cases, any of these films can serve as a invasion suppressive film.

A transfer mask of the present invention is characterized in that a transfer pattern has been formed in the thin film of the mask blank described above. Because the compressive stress in the thin film is suppressed from being increased with the passage of time, the mask blank maintains its flatness at a required high level after the passage of at least a prescribed time after production. Using the mask blank having such properties, the obtainable transfer mask can achieve a required high flatness. Further, because an increase in the compressive stress in the thin film has been suppressed, it is possible to reduce the amount of displacement that occurs on the main surface after an etching process for fabricating the transfer mask as a result of each portion of the pattern in the thin film being released from the surrounding compressive stress.

If a transfer mask is fabricated using a mask blank after a short time after the mask blank is produced by a conventional process, the transfer mask (a conventional transfer mask) has a required high flatness immediately after being fabricated. However, such a conventional transfer mask is deteriorated in flatness by an increase in the compressive stress in a thin film during storage in a mask case without being used or during continuous use in an exposure device. As a result, there is a risk with the conventional transfer mask that each portion of the pattern formed in the thin film will have a large displacement. The transfer mask of the present invention, which is fabricated using the mask blank produced by the process of the invention, can be suppressed from an increase in the compressive stress in the thin film with the passage of time. Thus, even when the transfer mask is stored in a mask case without being used after fabrication or even when the transfer mask is set in an exposure device and is continuously used, a required high flatness can be continuously maintained while suppressing a displacement of each portion of the pattern in the thin film.

Further, it is desirable that a highly oxidized layer containing oxygen at not less than 60 at % have been formed as a surface layer of the transfer pattern formed in the thin film of the transfer mask. The configurations, functions and effects of the highly oxidized layer and the highly oxidized layer including a tantalum-containing material are similar to those described hereinabove.

The transfer mask of the invention is usable as a binary mask, and is particularly suitably used when ArF excimer laser light is adopted as the exposure light. Alternatively, the transfer mask may be used as a trenched Levenson phase shift mask, a half tone phase shift mask, an enhancer-type phase shift mask, a chromeless phase lithography mask (a CPL mask) or the like. Further, because the transfer masks of the present invention have excellent pattern position accuracy, they are particularly suited for a transfer mask set used in double patterning techniques (such as DP technique and DE technique).

In the fabrication of the transfer mask, etching of the mask blank is favorably performed by dry etching that is effective for the formation of fine patterns. For example, dry etching of the thin film with a fluorine-containing etching gas may be performed using a fluorine-based gas such as $CF_4$, $C_2F_6$, $C_4F_8$, $CHF_3$ or $SF_6$. Further, dry etching of the thin film with an oxygen-free chlorine-containing etching gas may be performed using a chlorine-based gas such as $Cl_2$, $SiCl_2$, $CHCl_3$, $CH_2Cl_2$, $CCl_4$ or $BCl_3$, or a mixed gas including at least one of these chlorine-based gases and another gas such as He, $N_2$ and/or Ar.

Another aspect of the invention is directed to a process for manufacturing semiconductor devices using the aforementioned transfer mask, including transferring the transfer pattern of the transfer mask to a resist film on a semiconductor substrate by exposing the resist film through the transfer mask. By exposing a resist film on a semiconductor substrate through the aforementioned transfer mask to transfer the transfer pattern, a semiconductor device having a highly accurate pattern can be manufactured. A reason for this is because the transfer mask has high flatness and high pattern position accuracy that are required in the fabrication thereof. Another reason is because the transfer mask can continuously maintain a required high flatness and a displacement of each portion of the pattern in the thin film can be suppressed when the transfer mask is set in an exposure device and an exposure transfer process is started, after the transfer mask is stored for a given time in a mask case without being used after fabrication, or, as well as when the transfer mask is set in an exposure device and used in an exposure transfer process shortly after the mask is fabricated.

FIG. 1 illustrates an example of the mask blank of the invention. The mask blank illustrated in FIG. 1 includes a glass substrate 1 formed of synthetic quartz, on which a invasion suppressive film 6 based on tantalum and oxygen is formed with a thickness of 4.6 nm. On the invasion suppressive film 6, a lower layer (a light shielding layer) 2 based on tantalum and nitrogen as main components is formed with a thickness of 42.5 nm. On the lower layer 2, an upper layer (an antireflection layer) 3 based on tantalum and oxygen as main components is formed with a thickness of 5.5 nm. Preferably, a highly oxidized tantalum layer (not shown) is formed as a surface layer of the upper layer 3. The invasion suppressive film 6, the lower layer 2 and the upper layer 3, optionally including a highly oxidized tantalum layer, constitute a light shielding film 30.

Figure 2:
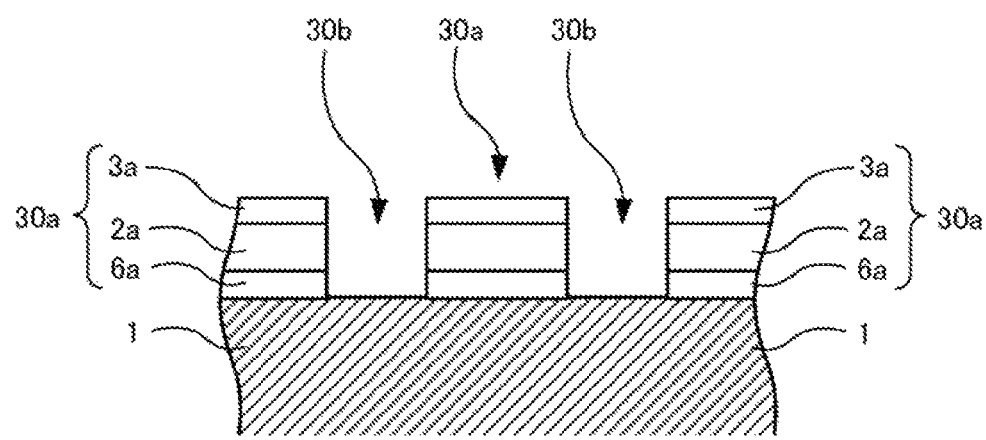
FIG. 2 is a cross sectional view illustrating a configuration of a transfer mask according to an embodiment of the present invention.

As illustrated in FIG. 2, a transfer mask in this embodiment is formed by patterning the light shielding film 30 of the mask blank shown in FIG. 1 to form a fine pattern on the glass substrate 1 that is constituted by light shielding sections 30*a* which are the remaining of the light shielding film 30 and light-transmitting sections 30*b* exposed by removing the light shielding film 30. A highly oxidized tantalum layer (not shown) may be formed as a surface layer of the light shielding film pattern (the thin film pattern) 30*a*. Further, a highly oxidized tantalum layer may be formed as a surface layer of a side wall of the light shielding film pattern 30*a*, namely, as a surface layer of side walls of a pattern 3*a* of the upper layer 3 and a pattern 2*a* of the lower layer 2. The highly oxidized tantalum layer may be formed on the side walls of the patterns 2*a* and 3*a* of the lower layer 2 and the upper layer 3, respectively, by a method similar to the method described hereinabove for forming the highly oxidized tantalum layer in the mask blank.

EXAMPLES

Next, examples in which mask blanks and transfer masks according to the above embodiment were produced will be described as worked examples with reference to FIGS. 3A to F.

Example 1

Production of Mask Blank of Example 1

A synthetic quartz ingot produced by a conventional production method (a soot method) was heat treated at not less than 1000° C. for at least 2 hours. Next, the heat treated synthetic quartz ingot was cut to give a synthetic quartz glass substrate having a length and width sizes of about 152 mm×152 mm and a thickness of 6.85 mm. Chamfer faces were appropriately formed.

The cut-out glass substrate was subjected to grinding on the main surfaces and end faces (side faces and chamfer faces). The main surfaces of the ground glass substrate were sequentially subjected to a rough polishing step and a precision polishing step. In detail, the glass substrate supported by a carrier was sandwiched between upper and lower surface plates of a double surface polishing device whose respective surfaces were fitted with polishing pads (hard polishers), and was caused to undergo a planetary gear motion while supplying a polishing liquid containing cerium oxide polishing abrasive particles (particle diameter: 2 to 3 μm in rough polishing step and 1 μm in precision polishing step) onto the plate surfaces. After each step, the glass substrate was washed by being soaked in a washing tank (while applying ultrasonic waves) to remove the polishing abrasive particles that had been attached thereto.

The washed glass substrate was subjected to an ultra-precision polishing step and a final polishing step with respect to the main surfaces of the glass substrate. In detail, the glass substrate supported by a carrier was sandwiched between upper and lower surface plates of a double surface polishing device whose respective surfaces were fitted with polishing pads (ultraflexible polishers), and was caused to undergo a planetary gear motion while supplying a polishing liquid containing colloidal silica polishing abrasive particles (particle diameter: 30 to 200 nm in ultra-precision polishing step and 80 nm average diameter in final polishing step) onto the plate surfaces. After the final polishing step, the glass substrate was washed by being soaked in a washing tank containing hydrofluoric acid and hydrofluorosilicic acid (while applying ultrasonic waves) to remove the polishing abrasive particles.

Regarding the glass substrate after the final polishing step, the thickness was 6.35 mm, the flatness in a region inside a 142 mm square about the center of the main surface (hereinafter, referred to as 142 mm square inner region) was not more than 0.3 μm, and the surface roughness Rq was not more than 0.2 nm. Thus, the glass substrate had a sufficient quality to be used in a 22 nm node mask blank.

Next, the washed glass substrate was introduced into a DC magnetron sputtering device. First, a mixed gas containing Ar and $O_2$ was introduced into the sputtering device, and a tantalum target was sputtered to form a invasion suppressive film (a TaO layer) 6 with a film thickness of 4.6 nm in contact with the main surface of the glass substrate 1 (see FIG. 3A). Next, the gas in the sputtering device was changed to a mixed gas containing Xe and $N_2$, and the tantalum target was sputtered to form a TaN layer (a lower layer) 2 with a film thickness of 42.5 nm on the surface of the invasion suppressive film 6 (see FIG. 3B). Further, the gas in the sputtering apparatus was changed to a mixed gas containing Ar and $O_2$, and similarly the tantalum target was sputtered to form a TaO layer (an upper layer) 3 with a film thickness of 5.5 nm, thereby producing a mask blank of Example 1 (see FIG. 3B).

Immediately after the mask blank of Example 1 was produced, the mask blank having a light shielding film 30 was analyzed with flatness meter UltraFLAT 200M (manufactured by Corning TOROPEL) to measure the flatness of the surface of the light shielding film 30 on the main surface of the substrate. Separately, a mask blank produced with the same conditions was subjected to HFS/RBS analysis. The results showed that the hydrogen content in the TaN film was not more than the lower detection limit.

Figure 4:
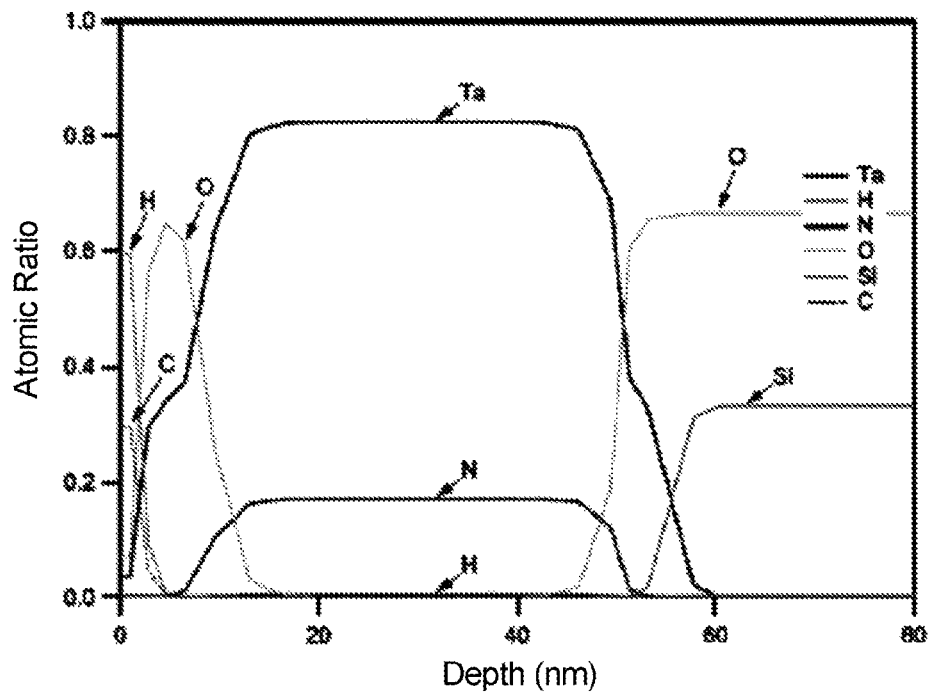
FIG. 4 is a diagram illustrating results of HFS/RBS analysis of a mask blank in Example 1.

Next, the mask blank of Example 1 was placed into a heating furnace, and the furnace was purged with nitrogen. An accelerated test was then performed in which the mask blank was heat treated at a heating temperature of 300° C. for 1 hour to forcibly incorporate hydrogen present in the substrate into the light shielding film. After the accelerated test, the mask blank having the light shielding film 30 was analyzed with flatness meter UltraFLAT 200M (manufactured by Corning TOROPEL) to measure the flatness of the surface of the light shielding film 30 on the main surface of the substrate. The difference in flatness in the 142 mm square inner region was 34 nm between before and after the accelerated test (the surface shape became convex after the accelerated test). This value of the difference in flatness was within the margin of measurement error, and it can be said that the flatness did not substantially change before and after the heat treatment. Further, the mask blank with the light shielding film 30 having undergone the accelerated test was subjected to HFS/RBS analysis, and the results were shown in FIG. 4. As clearly shown by the results in FIG. 4, the hydrogen content in the TaN layer 2 was not more than the lower detection limit. In view of the fact that the heating furnace contained a nitrogen atmosphere, the results conclude that the supply source of hydrogen possibly incorporated into the TaN layer 2 was the glass substrate and the invasion suppressive film 6 suppressed the invasion of hydrogen into the TaN layer.

In the mask blank of Example 1 manufactured as described above, the reflectance on the film surface of the light shielding film 30 (the surface reflectance) was 30.5% to ArF exposure light (wavelength 193 nm). The optical density to ArF exposure light was 3.05.

[Fabrication of Transfer Mask of Example 1]

Next, a transfer mask of Example 1 was fabricated in the following manner using the above-obtained mask blank of Example 1.

Figure 3A:
FIGS. 3A to 3F are cross sectional views illustrating a process of producing a transfer mask from a mask blank according to an embodiment of the present invention.
Figure 3B:
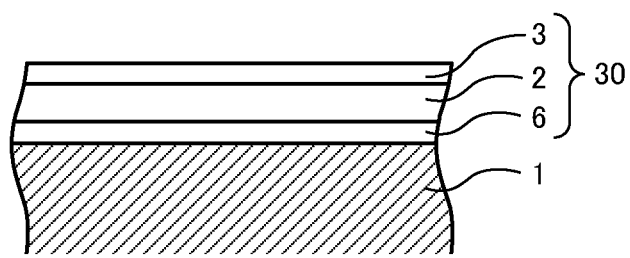
Figure 3C:
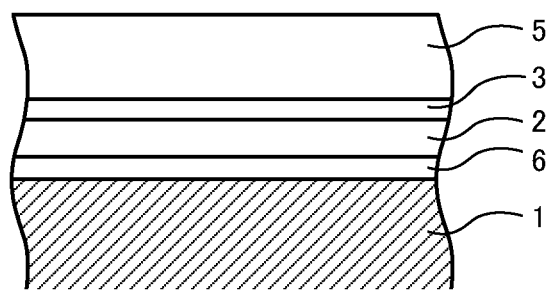
Figure 3D:
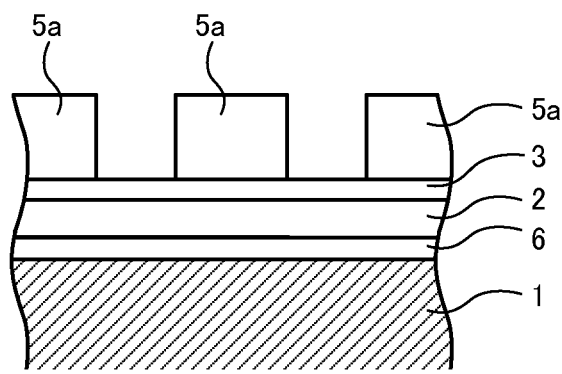

First, a chemically amplified resist 5 for electron beam lithography was spin coated with a film thickness of 100 nm (see FIG. 3C) and electron beam drawing and development were performed to form a resist pattern 5a (see FIG. 3D). This electron beam lithographic patterning used one of two divided patterns of relatively isolated two transfer patterns for forming a 22 nm node fine pattern using a double patterning technique.

Figure 3E:
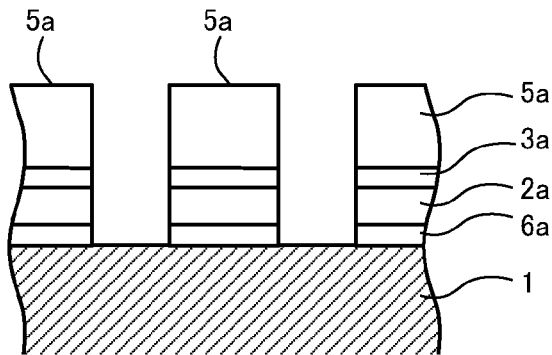
Figure 3F:
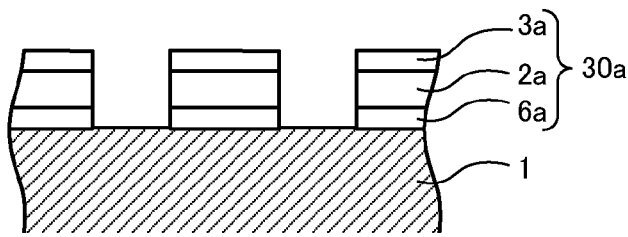

Next, dry etching was performed using predetermined etching gases to form patterns 3a, 2a and 6a of the TaO layer (the upper layer) 3, the TaN layer (the lower layer) 2 and the invasion suppressive film 6 (see FIG. 3E). Subsequently, the resist pattern 5a on a light shielding film pattern 30a was removed, thus obtaining the light shielding film pattern 30a functioning as a transfer mask (see FIG. 3F). In this manner, a transfer mask (a binary mask) was obtained.

Next, the fabricated transfer mask was subjected to a hot water treatment (a surface treatment) in which the mask was soaked in deionized water (DI water) at 90° C. for 120 minutes before natural oxidation proceeded (for example, within 1 hour after film production) or after the mask was stored under an environment that did not allow the progress of natural oxidation after film production. In this manner, a transfer mask of Example 1 was obtained.

The fabricated transfer mask of Example 1 was subjected to an accelerated test with the same conditions as those of the accelerated test for the mask blank (the furnace was purged with nitrogen, and a heat treatment was performed at 300° C. for 1 hour). Before and after the accelerated test, a pattern width and a space width were measured with respect to predetermined portions in the plane of the transfer mask. The changes in pattern width and space width before and after the accelerated test were both within acceptable ranges. A separate mask blank of Example 1 was patterned in the same manner to fabricate a transfer mask having a different transfer pattern. In the same manner, a transfer mask with one of two divided patterns of relatively isolated two transfer patterns for forming a 22 nm node fine pattern using a double patterning technique, was fabricated. Through the above procedures, a transfer mask set was obtained which included the two transfer masks capable of transferring a 22 nm node fine pattern to an object by exposure transferring according to a double patterning technique.

[Manufacturing of Semiconductor Device of Example 1]

Using the fabricated transfer mask set, a 22 nm node fine pattern was transferred to a resist film on a semiconductor device by exposing the resist film by a double patterning technique using an exposure device emitting ArF excimer laser light as the exposure light. After the exposure, the resist film on the semiconductor device was subjected to a predetermined development treatment to form a resist pattern. With the resist pattern as a mask, an underlying layer film was dry etched to form a circuit pattern. The circuit pattern formed in the semiconductor device was inspected, but any wire short circuits or wire disconnections caused by low overlay accuracy were not observed in the circuit pattern.

Comparative Example 1

Production of Mask Blank of Comparative Example 1

A glass substrate of synthetic quartz which was similar to that used in Example 1 was polished and washed in the same manner, thereby preparing a washed glass substrate. The washed glass substrate was subjected to sputtering with the same sputtering conditions as in Example 1 forming a light shielding film 30 including a TaN layer (a lower layer) 2 and a TaO layer (an upper layer) 3, except that a invasion suppressive film (a TaO layer) 6 was not formed. Immediately after the film production, the mask blank having the light shielding film 30 was analyzed with flatness meter UltraFLAT 200M (manufactured by Corning TOROPEL) to measure the flatness of the surface of the light shielding film 30 on the main surface of the substrate. Separately, a mask blank produced with the same conditions was subjected to HFS/RBS analysis. The results showed that the hydrogen content in the TaN film was not more than the lower detection limit.

Figure 5:
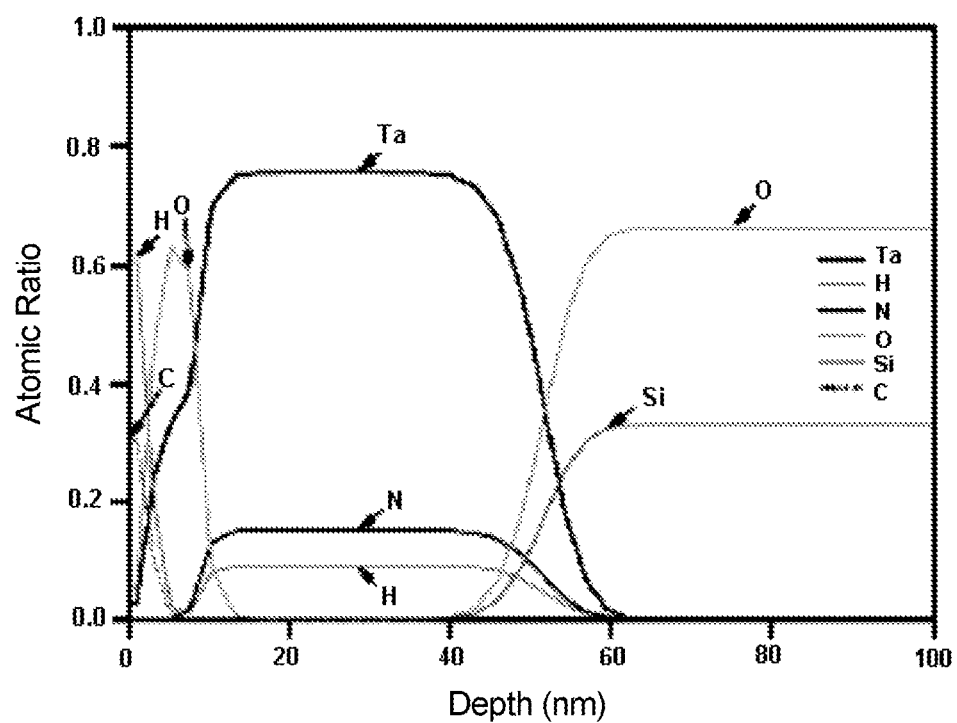
FIG. 5 is a diagram illustrating results of HFS/RBS analysis of a mask blank in Comparative Example 1.

Next, the glass substrate on which the light shielding film 30 that was a stacked structure including the TaN layer (the lower layer) 2 and the TaO layer (the upper layer) 3 had been formed was placed into a heating furnace, and the furnace was purged with nitrogen. An accelerated test was then performed in which the mask blank was heat treated at a heating temperature of 300° C. for 1 hour to forcibly incorporate hydrogen present in the substrate into the light shielding film. After the accelerated test, the mask blank having the light shielding film 30 was analyzed with flatness meter UltraFLAT 200M (manufactured by Corning TOROPEL) to measure the flatness of the surface of the light shielding film 30 on the main surface of the substrate. The difference in flatness in a 142 mm square inner region was as large as 219 nm between before and after the accelerated test (the surface shape became convex after the accelerated test) and it showed that the flatness was changed significantly. This difference in flatness was unacceptable at least for a 22 nm node mask blank. Further, the mask blank with the light shielding film 30 having undergone the accelerated test was subjected to HFS/RBS analysis, and the results were shown in FIG. 5. The results in FIG. 5 show that the TaN layer contained hydrogen at about 6.5 at %. From the results and in view of the fact that the heating furnace contained a nitrogen atmosphere, it can be said that the supply source of hydrogen possibly incorporated into the TaN layer was the glass substrate. Further, the obtained difference in flatness before and after the accelerated test indicated that the incorporation of approximately 6.5 at % of hydrogen into the TaN layer caused a marked deterioration in the flatness of the main surface.

[Fabrication of Transfer Mask of Comparative Example 1]

A mask blank of Comparative Example 1 was obtained by forming a light shielding film 30 that was a stacked structure including a TaN layer 2 and a TaO layer 3, in contact with a main surface of a glass substrate 1 with the same conditions as the mask blank of Comparative Example 1 was produced as described above. The obtained mask blank was fabricated into a transfer mask of Comparative Example 1 in the same manner as in Example 1. The fabricated transfer mask of Comparative Example 1 was subjected to an accelerated test with the same conditions as those for the mask blank (the furnace was purged with nitrogen, and a heat treatment was performed at 300° C. for 1 hour). Before and after the accelerated test, a pattern width and a space width were measured with respect to predetermined portions in the plane of the transfer mask. The changes in pattern width and space width before and after the accelerated test were both large and were apparently outside acceptable ranges at least for a transfer mask to be subjected to a 22 nm node double patterning technique. Thus, even if a transfer mask set was fabricated with fabricating a transfer mask with another one of divided patterns of relatively isolated two transfer patterns for forming a 22 nm node fine pattern using a double patterning technique, had been fabricated in the similar manner, such a transfer mask set apparently would not have been usable in double patterning because of its low overlay accuracy.

Separately, the mask blank that had been subjected to the aforementioned accelerated test was fabricated into a transfer mask of Comparative Example 1 in the same manner as in Example 1. The results were that the mask blank had already exhibited a drastic deterioration in flatness and, when the mask blank was chucked on a mask stage of an exposure device, the main surface to be patterned had heavy roughness which was apparently outside acceptable ranges at least for a transfer mask to be subjected to a 22 nm node double patterning technique. Because the compressive stress in the light shielding film had become markedly high, the dry etched pattern in the light shielding film was largely displaced from the drawing pattern of electron beam lithography.

Comparative Example 2

Production of Mask Blank of Comparative Example 2

A glass substrate of synthetic quartz which was similar to that used in Example 1 was polished and washed in the same manner, thereby preparing a washed glass substrate. Next, the washed glass substrate was introduced into a DC magnetron sputtering device. First, a mixed gas containing Xe, $N_2$ and $O_2$ was supplied into the sputtering device, and a tantalum target was sputtered to form a TaON layer (a lower layer) 2 with a film thickness of 43 nm on the surface of the glass substrate. Next, similarly to Example 1, the gas in the sputtering device was changed to a mixed gas containing Ar and $O_2$, and the tantalum target was sputtered to form a TaO layer (an upper layer) 3 with a film thickness of 6 nm, thereby producing a mask blank of Comparative Example 2.

In the above manner, a light shielding film 30 was produced on the glass substrate which included the TaON layer (the lower layer) 2 and the TaO layer (the upper layer) 3. Immediately after the film production, the mask blank having the light shielding film 30 was analyzed with flatness meter UltraFLAT 200M (manufactured by Corning TOROPEL) to measure the flatness of the surface of the light shielding film 30 on the main surface of the substrate. Separately, a mask blank produced with the same conditions was subjected to HFS/RBS analysis. The results showed that the hydrogen content in the TaON film was not more than the lower detection limit. The oxygen content in the TaON film was 8.9 at %.

Figure 6:
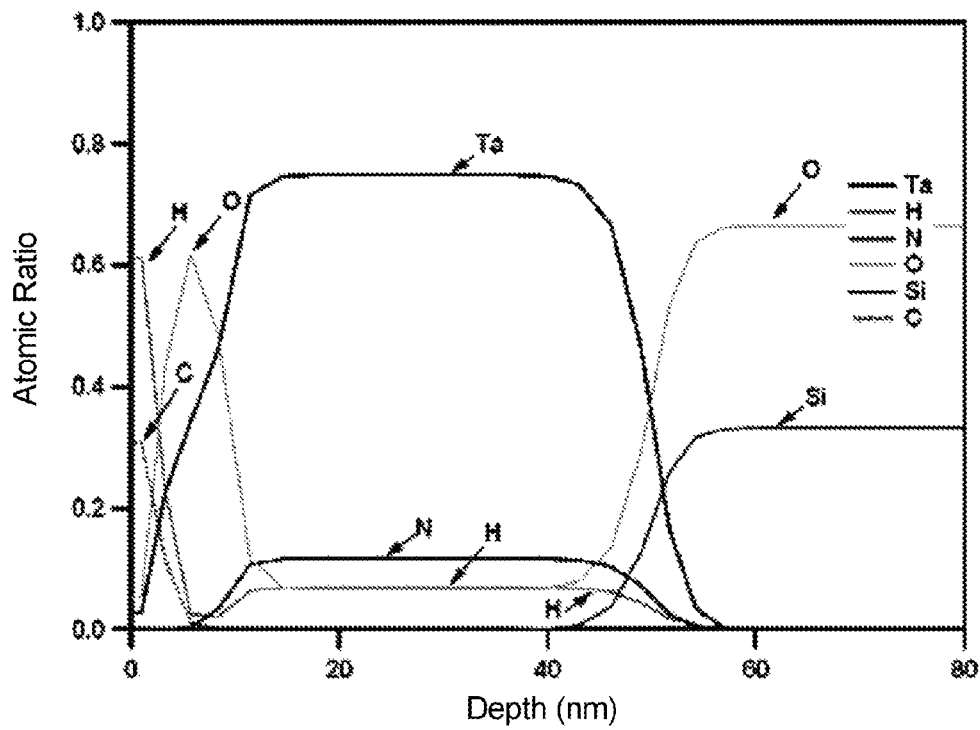
FIG. 6 is a diagram illustrating results of HFS/RBS analysis of a mask blank in Comparative Example 2.

Next, the glass substrate on which the light shielding film 30 that was a stacked structure including the TaON layer (the lower layer) 2 and the TaO layer (the upper layer) 3 had been formed was placed into a heating furnace, and the furnace was purged with nitrogen. An accelerated test was then performed in which the mask blank was heat treated at a heating temperature of 300° C. for 1 hour to forcibly incorporate hydrogen present in the substrate into the light shielding film. After the accelerated test, the mask blank having the light shielding film 30 was analyzed with flatness meter UltraFLAT 200M (manufactured by Corning TOROPEL) to measure the flatness of the surface of the light shielding film 30 on the main surface of the substrate. The difference in flatness in a 142 mm square inner region was as large as 309 nm between before and after the accelerated test (the surface shape became convex after the accelerated test) and it showed that the flatness was changed significantly. This difference in flatness was unacceptable at least for a 22 nm node mask blank. Further, the mask blank with the light shielding film 30 having undergone the accelerated test was subjected to HFS/RBS analysis, and the results are shown in FIG. 6. The results in FIG. 6 show that the TaON layer contained hydrogen at about 6.9 at %. The results indicate that the TaON layer did not have a suppressive effect on the invasion of hydrogen. Further, the obtained difference in flatness before and after the accelerated test indicated that the incorporation of approximately 6.9 at % of hydrogen into the TaON layer caused a marked deterioration in the flatness of the main surface.

[Fabrication of Transfer Mask of Comparative Example 2]

A mask blank of Comparative Example 2 was obtained by forming a light shielding film 30 that was a stacked structure including a TaON layer (a lower layer) 2 and a TaO layer (an upper layer) 3, in contact with a main surface of a glass substrate 1 with the same conditions as the mask blank of Comparative Example 2 was produced as described above. The obtained mask blank was fabricated into a transfer mask of Comparative Example 2 in the same manner as in Example 1. The fabricated transfer mask of Comparative Example 2 was subjected to an accelerated test with the same conditions as those for the mask blank (the furnace was purged with nitrogen, and a heat treatment was performed at 300° C. for 1 hour). Before and after the accelerated test, a pattern width and a space width were measured with respect to predetermined portions in the plane of the transfer mask. The changes in pattern width and space width before and after the accelerated test were both large and were apparently outside acceptable ranges at least for a transfer mask to be subjected to a 22 nm node double patterning technique. Thus, even if a transfer mask set was fabricated with fabricating a transfer mask with another one of divided patterns of relatively isolated two transfer patterns for forming a 22 nm node fine pattern using a double patterning technique, had been fabricated in the similar manner, such a transfer mask set apparently would not have been usable in double patterning because of its low overlay accuracy.

Separately, the mask blank that had been subjected to the aforementioned accelerated test was fabricated into a transfer mask of Comparative Example 2 in the same manner as in Example 1. The results were that the mask blank had already exhibited a drastic deterioration in flatness and, when the mask blank was chucked on a mask stage of an exposure device, the main surface to be patterned had heavy roughness which was apparently outside acceptable ranges at least for a transfer mask to be subjected to a 22 nm node double patterning technique. Because the compressive stress in the light shielding film had become markedly high, the dry etched pattern in the light shielding film was largely displaced from the drawing pattern of electron beam lithography.

Example 2

Production of Mask Blank of Example 2

A glass substrate of synthetic quartz which was similar to that used in Example 1 was polished and washed in the same manner, thereby preparing a washed glass substrate 1. Next, the washed glass substrate 1 was introduced into a DC magnetron sputtering device equipped with a Si (silicon) target. A mixed gas containing Ar and NO was supplied into the sputtering device, and the Si target was sputtered to form a invasion suppressive film (a SiON layer) 6 with a film thickness of 30 nm in contact with the main surface of the glass substrate 1. Next, the glass substrate 1 with the invasion suppressive film 6 was introduced into a sputtering device equipped with a tantalum target. Similarly to Example 1, a mixed gas containing Xe and $N_2$ was supplied and the tantalum target was sputtered to form a TaN layer (a lower layer) 2 with a film thickness of 43 nm on the surface of the invasion suppressive film 6. Next, the gas in the sputtering device was changed to a mixed gas containing Ar and $O_2$, and similarly the tantalum target was sputtered to form a TaO layer (an upper layer) 3 with a film thickness of 6 nm, thereby producing a mask blank 5 of Example 2.

Immediately after the mask blank of Example 2 was produced, the mask blank having a light shielding film 30 was analyzed with flatness meter UltraFLAT 200M (manufactured by Corning TOROPEL) to measure the flatness of the surface of the light shielding film 30 on the main surface of the substrate. Separately, a mask blank produced with the same conditions was subjected to HFS/RBS analysis. The results showed that the hydrogen content in the TaN film was not more than the lower detection limit. The results of the HFS/RBS analysis showed that the composition of the SiON layer consisted of Si: 38.1 at %, O: 42.7 at % and N: 19.2 at %.

Next, the mask blank of Example 2 was housed in air into a storage case (a blank case) commonly used in transporting and storage of mask blanks. After the mask blank of Example 2 was housed, the gap between the case body and the lid was sealed with a pressure-sensitive adhesive tape. The mask blank of Example 2 housed in the storage case was stored for 180 days. After this long-term storage, the mask blank of Example 2 was taken out from the storage case and was analyzed with flatness meter UltraFLAT 200M (manufactured by Corning TOROPEL) to measure the flatness of the surface of the light shielding film 30. The difference in flatness in a 142 mm square inner region was 59 nm between immediately after the light shielding film 30 was produced and after the long-term storage (the surface shape became convex after the long-term storage). This value of the difference in flatness was within acceptable ranges for a 22 nm node mask blank. Thus, the mask blank of Example 2 maintained a sufficient quality for the fabrication of a transfer mask even after the long-term storage.

Further, the mask blank of Example 2 having undergone the long-term storage was subjected to HFS/RBS analysis. The hydrogen content in the TaN layer 2 was not more than the lower detection limit. In view of the fact that the mask blank of Example 2 was housed in the tightly closed storage case during the long-term storage, the above result concludes that the supply source of hydrogen possibly incorporated into the TaN layer 2 was substantially the glass substrate and the invasion suppressive film 6 suppressed the invasion of hydrogen into the TaN layer.

[Fabrication of Transfer Mask of Example 2]

Next, a transfer mask (a binary mask) of Example 2 was fabricated using the above mask blank of Example 2 in the same manner as in Example 1, except that the invasion suppressive SiON film 6 was not patterned. Because SiON was a material exhibiting high transmittance to ArF excimer laser light, its effects on pattern transfer properties would be limited even if the invasion suppressive film 6 was remained in the light-transmitting section of the fabricated transfer mask. The fabricated transfer mask of Example 2 was housed into a sheet storage case (tightly closable for storage without a pressure-sensitive adhesive tape) for storing transfer masks and was stored for 180 days. Before and after this long-term storage, a pattern width and a space width were measured with respect to predetermined portions in the plane of the transfer mask. The changes in pattern width and space width before and after the long-term storage were both within acceptable ranges. A separate mask blank of Example 2 was patterned in the same manner to fabricate a transfer mask having a different transfer pattern. In the same manner, a transfer mask with another one of divided patterns of relatively isolated two transfer patterns for forming a 22 nm node fine pattern using a double patterning technique, was fabricated. Through the above procedures, a transfer mask set was obtained which included the two transfer masks capable of transferring a 22 nm node fine pattern to an object by exposure transferring according to a double patterning technique.

[Manufacturing of Semiconductor Device of Example 2]

Using the fabricated transfer mask set, a 22 nm node fine pattern was transferred to a resist film on a semiconductor device by exposing the resist film by a double patterning technique using an exposure device emitting ArF excimer laser light as the exposure light. After the exposure, the resist film on the semiconductor device was subjected to a predetermined development treatment to form a resist pattern. With the resist pattern as a mask, an underlying layer film was dry etched to form a circuit pattern. The circuit pattern formed in the semiconductor device was inspected, but any wire short circuits or wire disconnections caused by low overlay accuracy were not observed in the circuit pattern.

The invention claimed is:

1. A mask blank comprising a glass substrate and a thin film formed above a main surface of the glass substrate, wherein
   the thin film comprises a material containing tantalum and substantially no hydrogen, and
   the mask blank has an invasion suppressive film between the main surface of the glass substrate and the thin film, and the invasion suppressive film suppresses hydrogen invading from the glass substrate into the thin film.

2. The mask blank according to claim 1, wherein the invasion suppressive film comprises a material containing tantalum and oxygen.

3. The mask blank according to claim 2, wherein the invasion suppressive film contains oxygen at not less than 50 at %.

4. The mask blank according to claim 1, wherein the invasion suppressive film is formed in contact with the main surface of the glass substrate on the side where the thin film is formed.

5. The mask blank according to claim 1, wherein the main surface of the glass substrate on the side where the thin film is formed has a surface roughness of not more than 0.2 nmRq.

6. The mask blank according to claim 1, wherein the thin film comprises a material which contains tantalum and nitrogen and does not substantially contain hydrogen.

7. The mask blank according to claim 6, wherein a highly oxidized layer containing oxygen at not less than 60 at % is formed as a surface layer of the thin film.

8. The mask blank according to claim 1, wherein the thin film has a structure in which a lower layer and an upper layer are laminated in this order from the glass substrate side, the lower layer comprises a material which contains tantalum and nitrogen and does not substantially contain hydrogen, and the upper layer comprises a material which contains tantalum and oxygen.

9. The mask blank according to claim 8, wherein a highly oxidized layer containing oxygen at not less than 60 at % is formed as a surface layer of the upper layer.

10. A transfer mask wherein a transfer pattern is formed in the thin film of the mask blank according to claim 1.

11. A process for manufacturing semiconductor devices using the transfer mask according to claim 10, wherein the process comprises transferring the transfer pattern of the transfer mask to a resist film on a semiconductor substrate by exposing the resist film through the transfer mask.

12. The mask blank according to claim 1, wherein the invasion suppressive film has a thickness of not less than 2 nm and not more than 10 nm.

13. The mask blank according to claim 1, wherein a Ta 4f narrow spectrum of the invasion suppressive film analyzed by X-ray photoelectron spectroscopy has a maximum peak at a binding energy of not less than 25 eV.

14. The mask blank according to claim 1, wherein the invasion suppressive film comprises a material containing silicon and oxygen.

15. The mask blank according to claim 14, wherein the invasion suppressive film contains a metal at not more than 5 at %.

16. The mask blank according to claim 14, wherein the invasion suppressive film contains no metals.

17. The mask blank according to claim 14, wherein the invasion suppressive film has a thickness of not less than 5 nm and not more than 50 nm.

18. The mask blank according to claim 14, wherein a ratio between silicon and oxygen in the invasion suppressive film is 1:1 to 1:2.

* * * * *